United States Patent
Sakui et al.

(10) Patent No.: US 6,418,058 B1
(45) Date of Patent: Jul. 9, 2002

(54) NONVOLATILE SEMICONDUCTOR MEMORY DEVICE

(75) Inventors: Koji Sakui, Tokyo-To; Hiroshi Nakamura, Kawasaki; Kenichi Imamiya, Tokyo-To, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/994,828

(22) Filed: Nov. 28, 2001

Related U.S. Application Data

(63) Continuation of application No. 09/632,843, filed on Aug. 4, 2000, now Pat. No. 6,330,189.

(30) Foreign Application Priority Data

Aug. 6, 1999 (JP) ............................................ 11-224232

(51) Int. Cl.[7] .............................................. G11C 16/06
(52) U.S. Cl. ........................... 365/185.22; 365/185.17; 365/185.18; 365/185.29
(58) Field of Search ....................... 365/185.22, 185.29, 365/185.05, 185.12, 185.17, 185.18, 185.25

(56) References Cited

U.S. PATENT DOCUMENTS 5,623,442 A * 4/1997 Gotou et al. ................ 365/149
6,304,485 B1 * 10/2001 Harari et al. ............ 365/185.09

* cited by examiner

Primary Examiner—Richard Elms
Assistant Examiner—Hien Nguyen
(74) Attorney, Agent, or Firm—Oblon, Spivak, McClelland, Maier & Neustadt, P.C.

(57) ABSTRACT

In NAND type EEPROM capable of high-speed rewriting by ensuring that the memory cell current during write verify read-out operation is larger than that during normal data read-out operation, a NAND cell is composed of a plurality of serially connected memory cells (MC0 through MC31) and selection transistors (SST and GST). During data write operation, a voltage (Vpgm) is applied to a selected word line of a selected block, and a pass voltage (Vpass2) is applied to non-selected word lines to introduce electrons to the floating gate of the selected memory cell. In verify read-out operation after data write operation, a verify read-out voltage is applied to the selected word line and a pass voltage (Vpass3) to non-selected word lines. The pass voltage (Vpass3) applied to non-selected word lines during verify read-operation is higher than the pass voltage (Vpass1) applied to non-selected word lines during normal data read-out operation.

6 Claims, 13 Drawing Sheets

[DATA ERASE]

| | POTENTIAL |
|---|---|
| SSL | α×Vera FLOATING |
| SELECTED BLOCK WL0~WL31 | Vss |
| NON-SELECTED BLOCK WL0~WL31 | α×Vera FLOATING |
| GSL | α×Vera FLOATING |
| BL0,BL1 | Vera-Vf |
| SL | Vera-Vf |
| P-well | Vera |

[DATA WRITE]

| | POTENTIAL |
|---|---|
| SSL | Vpass1 |
| SELECTED WORD LINE WL17 IN THE SELECTED BLOCK | Vpgm |
| NON-SELECTED WORD LINES WL0–WL16, WL18–WL31 IN THE SELECTED BLOCK | Vpass2 |
| GSL | Vss |
| BIT LINE BL1 WHERE DATA "0" IS WRITTEN | Vss |
| BIT LINE BL1 WHERE DATA "1" IS WRITTEN | Vcc |
| SL | Vcc |
| P-well | Vss |

FIG.8

[VERIFY READ]

| | POTENTIAL |
|---|---|
| SSL | Vpass3 |
| SELECTED WORD LINE WL17 IN THE SELECTED BLOCK | Vref |
| NON-SELECTED WORD LINES WL0-WL16, WL18-WL31 IN THE SELECTED BLOCK | Vpass3 |
| GSL | Vpass3 |
| BIT LINE BL0 WHERE DATA "0" IS WRITTEN | Vbl→Vbl |
| BIT LINE BL1 WHERE DATA "1" IS WRITTEN | Vbl→Vss |
| SL | Vss |
| P-well | Vss |

Vpass3 > Vpass1

FIG.10

[DATA READ]

| | POTENTIAL |
|---|---|
| SSL | Vpass1 |
| SELECTED WORD LINE WL17 IN THE SELECTED BLOCK | Vss |
| NON-SELECTED WORD LINES WL0-WL16, WL18-WL31 IN THE SELECTED BLOCK | Vpass1 |
| GSL | Vpass1 |
| BIT LINE BL0 WHERE DATA"0" IS WRITTEN | Vbl→Vbl |
| BIT LINE BL1 WHERE DATA"1" IS WRITTEN | Vbl→Vss |
| SL | Vss |
| P-well | Vss |

FIG.12

|  | ERASE | READOUT | WRITE |
|---|---|---|---|
| SELECTED WL | 0 | 0 | Vpgm |
| NON-SELECTED WL | 0 | Vread | Vpass |
| SSL | F | Vread | Vcc |
| GSL | F | Vread | 0 |
| "0" BL | F | 1.5 | 0 |
| "1" BL | F | 0.7 | Vcc |
| P WELL | Vera | 0 | 0 |

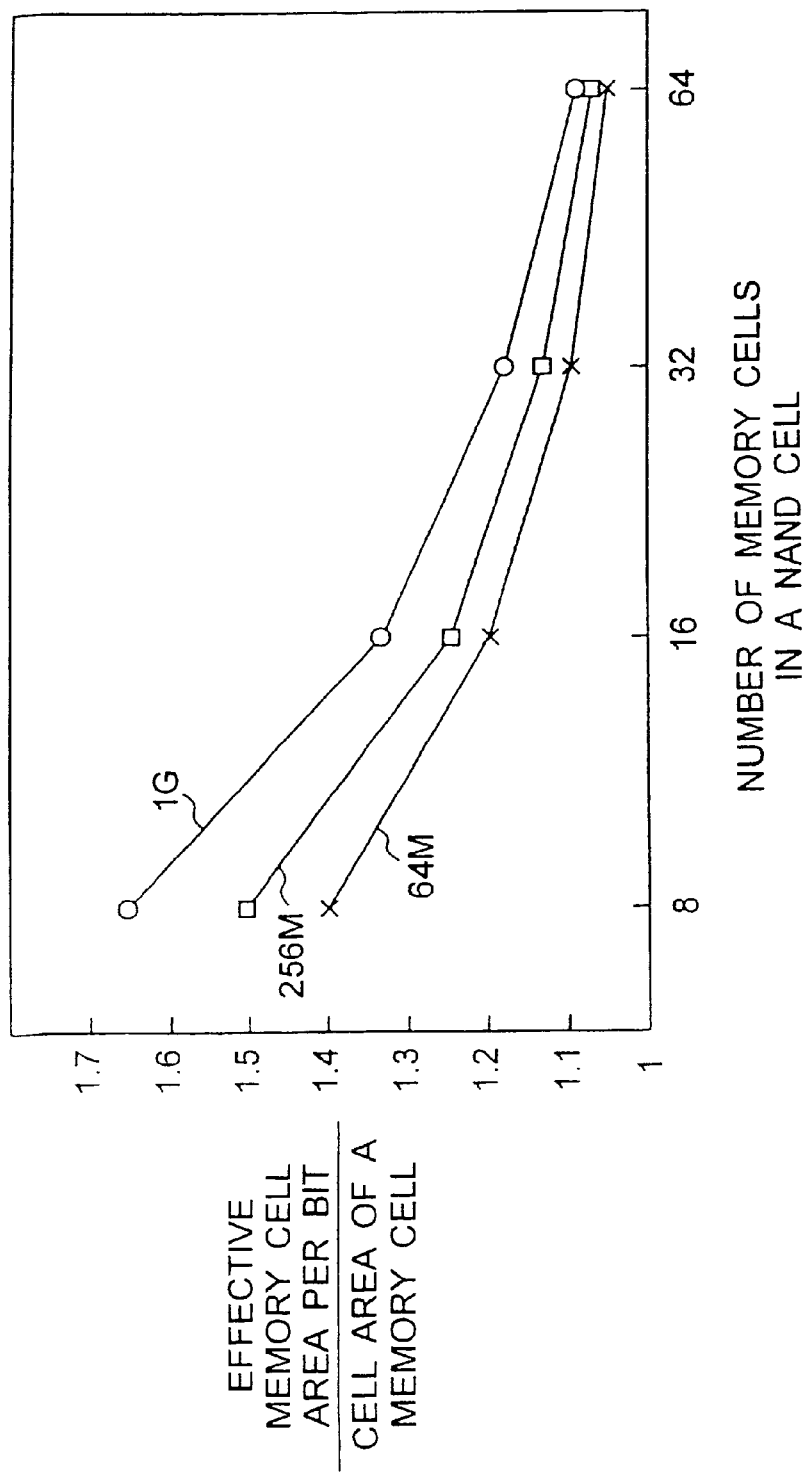
FIG. 16 *PRIOR ART*

NONVOLATILE SEMICONDUCTOR MEMORY DEVICE

This application is a continuation of U.S. application Ser. No. 09/632,843, filed Aug. 4, 2000, now U.S. Pat. No. 6,330,189.

CROSS REFERENCE TO RELATED APPLICATIONS

The subject application is related to subject matter disclosed in Japanese Patent Application No. H11-224232 filed on Aug. 6, 1999 in Japan to which the subject application claims priority under Paris Convention and which is incorporated herein by reference.

BACKGROUND OF THE INVENTION

This invention relates to a nonvolatile semiconductor memory device (EEPROM: Electrically Erasable Programmable ROM) including memory cell units in which a plurality of electrically rewritable memory cells are connected.

A NAND type EEPROM has been known as a kind of EEPROM enabling electrical rewriting. A single memory cell of NAND type EEPROM has a FETMOS (Floating gate Electrically erasable Tunneling MOS) structure stacking a floating gate (charge storage layer) and a control gate on a semiconductor substrate via an insulating film. A plurality of memory cells are connected in series while sharing common source and drain between every adjacent ones thereof to form a NAND type memory cell unit (hereinafter simply called NAND cell). Such NAND cells are arranged in form of a matrix to make up a memory cell array.

Drains at one-side ends of NAND cells aligned in the column direction of a memory cell array are commonly connected to a bit line via a selection gate transistor, and sources at the other common ends are connected to a common source line via a selection gate transistor, here again. Word lines of memory transistors and gate electrodes of selection transistors are commonly connected in the column direction of the memory cell array as a word line (control gate line) and a selection gate line, respectively.

This kind of NAND type EEPROM is known from the following literatures (1) and (2), for example.

(1) K. D. Suh, et al., "A 3.3V 32 Mb NAND Flash Memory with Incremental Step Pulse Programming Scheme," IEEE J. Solid-State Circuits, Vol. 30, pp. 1149–1156, November 1995

(2) Y. Iwata et al., "A 35 ns Cycle Time 3.3V Only 32 Mb RAND Flash EEPROM," IEEE J. Solid-State Circuits, Vol. 30, pp. 1157–1164, November 1995.

FIG. 14 shows configuration of a single NAND cell block in a memory cell array of NAND cell type EEPROM. A plurality of memory cells M. are connected in series while sharing common source and drain between every adjacent ones thereof to form a NAND type memory cell unit. An end of each RAND cell is connected to a bit line BL via a selection transistor S1, and the other end thereof is connected to a common grounded line via a selection transistor S2. Control gates of memory cells M aligned in the horizontal direction in FIG. 14 are commonly connected to a word line WL. Similarly, gates of the selection transistors S1 and S2 are commonly connected to selection gate lines SSL and GSL, respectively. The range of RAND cells driven by a single word line makes up a RAND cell block.

In general, a plurality of such RAND cell blocks are arranged in the bit line direction to form a memory cell array.

Each RAND cell block is the minimum unit for data erasure, and so-called flash erasure (collective erasure) is conducted therefore. A series of memory cells aligned along a single selected word line within the RAND cell block is called one page, and one page is the unit for reading and writing data.

Each memory cell M stores data by representing the status with a positive threshold value due to injection of electrons into the floating gate (E (Enhancement) type status) and the status with a negative threshold value due to discharge of electrons from the floating gate (D (Depletion) type status) by using two values, respectively. For example, it is determined that the D type status is the status holding "1" data (erasure mode) and the E type status is the status holding "0" data (write mode). Additionally, it is defined that the operation shifting the threshold value of a memory cell holding "1" data toward the positive direction and changing it into the status holding "1" data is "write operation", and operation shifting the threshold value of a memory cell holding "0" data toward the negative direction and changing it into the status holding "1" data is "erase operation". In this specification, explanation is progressed according to such definition.

FIG. 15 shows relations among voltages of different portions data erase, read-out, write operations in a selected NAND cell block of a memory cell array. In erase operation, all word lines in a selected NAND cell block are set in 0V, and the selection gate lines SSL, GSL and bit line BL are held floating (F). Then a high positive erase voltage Vera (for example, erase pulse of 3 ms and 21V) to P-type wells of memory cells. As a result, in the selected block, an erase voltage is applied between wells and word lines, and electrons are released from the floating gate to the wells by a FN(Fowler-Nordheim) tunneling current. Consequently, memory cells in the NAND cell block become the erase mode of "1".

At that time, in non-selected NAND cell blocks, there are no influences from the erase pulse because of capacity coupling of floating-status word lines and wells. The coupling ratio is calculated from the capacitance connected to word lines under the floating status. Actually, capacities of poly-silicon word lines and P wells in cell regions occupy an overwhelming part of the whole capacity, and the coupling ratio obtained from a result of actual measurement is as large as about 0.9 and disturbs the flow of FN tunneling current. For verifying erasure, it is judged whether threshold voltage has become −1V or lower in all memory cells in the selected block.

Data read-out operation is effected by applying 0V to the selected word line and a predetermined intermediate voltage Vread (a voltage independent from the threshold value and large enough to render the channel conductive) to non-selected word lines and selection gate lines, and by reading changes in potential of the bit lines BL caused by conduction or non-conduction of the selected memory cells.

Data write operation is effected by applying a positive high write voltage Vpgm to the selected word line, an intermediate voltage Vpass to non-selected word lines, Vcc to the selection gate line SSL on the part of bit lines, and Vss=0V to the selection gate line GSL on the part of common source line, and applying Vss to bit lines BL to write "0" in, and Vcc to bit lines prohibited to write (that is, bit lines to be maintained in the erase mode of "1"). At that time, in a selected memory cell connected to the bit line supplied with Vss, the channel potential is held in Vss, a large electric field between the control gate and the channel is applied, and electrons are injected from the channel to the floating gate due to a tunneling current. In the other non-selected memory cells connected to the same bit line and applied with Vpass, electric field is not sufficient for writing. Therefore, writing is not effected.

In memory cells along a bit line applied with Vcc, channels of the NAND cell are pre-charged to Vcc or Vcc-Vth (Vth is the threshold voltage of the selection transistor), and the selection transistor is cut off. Then, when the write voltage Vpgm and the intermediate voltage Vpass are applied to the control gates, the channel potential increases due to capacity coupling between the NAND cell channels in the floating status and the control gates applied with Vpgm or Vpass, and electron injection does not occur.

In this manner, only in the memory cell at the crossing point of the bit line applied with Vss and the selected word line applied with Vpgm, electrons are injected, and "0" is written. In memory cells prohibited to write in within the selected block, since the channel potential is determined by capacity coupling between word lines and channels, in order to apply a sufficiently high write prohibiting voltage, it is important to ensure sufficient initial charging of channels and increase the capacity coupling ratio between word lines and channels.

Coupling ratio B between word lines and channels is calculated by B=Cox/(Cox+Cj) where Cox and Cj are the lump sum of gate capacities between word lines and channels and the lump sum of junction capacities of sources and drains of memory cell transistors, respectively. Channel capacity of a NAND cell is the total of this gate capacity lump sum Cox and the junction capacity lump sum Cj. The other capacities, such as overlap capacity of selection gate lines and sources, capacity of bit lines and sources/drains, etc., are very small as compared with the capacity of all channels, they are disregarded here.

The issue of scaling in the above-explained NAND type EEPROM is next explained with reference to FIG. 16. FIG. 16 shows relations between the number of memory cells in a NAND cell and the ratio of the effective memory cell area per bit over the area of one memory cell, taking the memory capacity as a parameter. A feature of NAND type EEPROM lies in that the effective memory size can be reduced as a result of common use of two selection gate transistors and contacts of bit lines and source lines by a plurality of memory cells.

In case of 0.4 $\mu$m rule, 64 Mb NAND type EEPROM, the number of memory cells in a NAND cell is 16, and the ratio of the effective memory cell area per bit over the area of one memory cell was 1.20 as shown in FIG. 16. In 0.2 $\mu$m rule, 256 Mb NAND type EEPROM, if the number of memory cells in a NAND cell is 16 equally, the ratio of the effective memory cell area per bit over the area of one memory cell is 1.26. Further, in a 0.13 $\mu$m rule, 1 Gb NAND EEPROM, assuming the number of memory cells being 16 here again, this ratio is estimated to become 1.33.

A reason why the ratio of the effective memory cell area over the actual memory cell area increases with miniaturization and increase of the capacity lies in that, although the pitch of word lines (width of each word line+space) can be reduced in accordance with the design rule, it makes it difficult to reduce contact areas of the selection transistors as overheads with the bit lines and the source lines. This is caused, in one aspect, from difficulty of the process for making minute contacts, etc., but in the other aspect, there is another reason attendant to the device design, namely, miniaturization being limited by the need for a margin for write operation. Whichever the reason is, when the number of memory cells in a NAND cell is limited to 16, the effective memory size increases from that of 64 Mb as a reference by 5% (1.12/1.20=1.05) in case of 256 Mb and by 11% (1.33/1.20=1.11) in case of 1 Gb.

In contrast, when the number of memory cells in a NAND cell of 1 Gb NAND type EEPROM is increased to 32, the ratio of the effective memory cell area per bit over the area of one memory cell decreases to 1.17, and the chip size decreases to 88%. However, this is applicable when the area of a chip occupied by the memory cell array is assumed to be 60% in both cases. However, increasing memory cells in each NAND cell invites other problems.

The first one of the problems is that the block size of flash erasure of data is doubled. However, this is mainly a problem concerning the specification, and can be removed. For example, capacity required for one shot of a digital camera of 300,000 pixels is about 0.5 Mb, and it corresponds to the capacity of four blocks of 16 kilobytes. However, as the capacity of digital cameras increases to 1.3 million pixels or 2 million pixels, the number of blocks necessary for one shot increases when the block size is fixed to 16 kilobytes. Such increase of blocks leads to the problem of decreasing the writing speed of one shot. Therefore, in certain cases, EEPROM is desired to increase the book size to a certain level along with an increase of its capacity.

The second one of the problems is that doubling the number of memory cells results in reducing the memory cell current by half. When the memory cell current reduces by half, the bit line sensing time during read-out operation, namely, the time from selection of a word line to activation of a sense amplifier is doubled. If the number of memory cells in a NAND cell is 16, ion case of 1 Gb, it is planned that the bit line capacity is 3.4 pF, the bit line amplitude is 0.7V, and the memory cell current is 0.5 $\mu$A, and in this case, the bit line sensing time is 4.65 $\mu$s. If memory cells in a NAND cell are increased from 16 to 32 under the condition that the bit line capacity does not change, the bit line sensing time becomes 9.52 $\mu$s.

Such increase of the bit line sensing time not only increases the random read-out time but also causes the write time to increase. Specification of the random read-out time normally becomes about a double of the bit line sensing time because the time of entering a command and an address, the time for selecting a word line, the time for outputting data and their margins are added to the bit lien sensing time. If the device is designed to include 16 memory cells in a NAND cell, the random read-out time can be limited within 10 $\mu$s. Since a write pulse is about 20 $\mu$s, the write cycle time is about 30 $\mu$s (10 s+20 $\mu$s). Therefore, in the case where writing is completed by six write cycles, the write time is 30 $\mu$s×6=180 $\mu$s. In contrast, if the device is designed to include 32 memory cells in a NAND cell, since the random read-out time becomes 20 $\mu$s, the write cycle time is about 40 $\mu$s, and the write time is 40 $\mu$s×6=240 $\mu$s.

Therefore, when the write time is fixed to 200 $\mu$s as the specification, the write cycle has to be limited to 5 or less. For this purpose, load to a process, like the need for minimizing fluctuation of the coupling ratio of memory cells, increases. If improvement of the process cannot be expected, specification of the write time, for example, has to be relaxed from 200 $\mu$s to 300 $\mu$s. This is a great hazard against progressing the feature of NAND type EEPROM, i.e., high-speed rewriting.

NAND EEPROM rewrites data by FN tunneling over the entire surface of a channel, which is different from writing by hot electron injection employed by NOR type EEPROM and erasure at the source side by using band-to-band tunneling. Therefore, a large number of memory cells can be rewritten simultaneously. As a result, when the time for loading data to be written is disregarded, the writing throughput can be doubled and quadrupled by increasing the writing page size from 512 bytes to 1 kilobyte and further to 2 kilobytes. By making use of the feature of high-speed rewriting, applications of NAND type EEPROM are being extended to voice (voice recorder), images (digital still camera), audio and moving pictures. However, if the verify read-out speed after data write decreases because of reduction of the cell current and it results in a decrease of the page writing speed, applications of NAND EEPROM will be limited.

The random read-out time does not matter so much even if it increases from 10 μs to 20 μs, for example. That is, since NAND type EEPROM is not a device intended or random bit processing but a device intended for block data processing, the speed of queue search is not important. For example, when a mass of data over 16 pages is to be read out, a random read-out time is required as the time for queue search to read out the first one page. However, for the second page, et seq., by executing sequential page read-out (a mode for progressing the sensing operation of the next page in parallel with read-out operation of the preceding page), no time for random read-out is required upon movement from page to page.

SUMMARY OF THE INVENTION

It is therefore an object of the invention to provide a nonvolatile semiconductor memory device capable of high-speed rewriting by increasing the memory cell current for verify read-out relative to that for normal data read-out.

More specifically, it is the object of the invention to provide a nonvolatile semiconductor memory device that minimizes degradation of the writing speed when the number of memory cells in a NAND cell is increased and the effective memory cell area per bit is decreased.

According to the first aspect of the present invention, there is provided a nonvolatile semiconductor memory device comprising:

a memory cell array having a matrix arrangement of electrically rewritable memory cells which form a plurality of memory cell units each including a plurality of said memory cells;

a decode circuit for decoding an address and selecting a memory cell of said memory cell array;

a sense amplifier circuit for detecting read-out data from said memory cell array and latching write data to said memory cell array;

a read-out control means for reading out data from a memory cell selected from a memory cell unit selected by said decode circuit;

a write control means for writing data in a memory cell selected from a memory cell unit selected by said decode circuit by applying a write voltage thereto; and a write verify read-out control means for reading out data from a selected memory cell in order to confirm the status of data writing by said write control means, under a bias condition ensuring a larger memory cell current to flow in its conductive status than that during data read-out operation by said read-out control means.

According to the second aspect of the present invention, there is provided a nonvolatile semiconductor memory device comprising:

a memory cell array having a matrix arrangement of electrically rewritable memory cells driven by word lines, said memory cells form a plurality of NAND-type memory cell units each including a plurality of said memory cells serially connected to a bit line;

a decode circuit for decoding an address and selecting a word line and a bit line of said memory cell array;

a sense amplifier circuit for detecting data read out onto a bit line of said memory cell array and latching write data to said memory cell array;

a read-out control means for reading out data by applying a read-out voltage to a selected word line in an NAND type memory cell unit selected from said decode circuit and applying a first pass voltage to non-selected word lines, said first pass voltage being determined to make memory cells conductive;

a write control means for writing data by applying a write voltage to a selected word line in an NAND type memory cell unit selected by said decode circuit and applying a second pass voltage lower than said write voltage to non-selected word lines; and a write verify read-out control means for reading data in order to confirm the status of data writing by said write control means under a condition ensuring a larger current to flow in the conductive status of the selected NAND type memory cell unit than that during data read-out operation by said read-out control means, by applying a verify read-out voltage to a selected word line in the selected NAND type memory cell unit and applying a third pass voltage to non-selected word lines, said third pass voltage being determined to make memory cells conductive.

According to the third aspect of the present invention, here is provided a nonvolatile semiconductor memory device comprising:

a memory cell array having a matrix arrangement of electrically rewritable memory cells driven by word lines, said memory cells form a plurality of NAND-type memory cell units each including a plurality of said memory cells serially connected to a bit line;

a decode circuit for decoding an address and selecting a word line and a bit line of said memory cell array;

a sense amplifier circuit for detecting data read out onto a bit line of said memory cell array and latching write data to said memory cell array;

a read-out control means for reading out data by applying a read-out voltage to a selected word line in an NAND type memory cell unit selected from said decode circuit and applying a first pass voltage to non-selected word lines, said first pass voltage being determined to make memory cells conductive;

a write control means for writing data by applying a write voltage to a selected word line in an NAND type memory cell unit selected by said decode circuit and applying a second pass voltage lower than said write voltage to non-selected word lines; and a write verify read-out control means for reading data in order to confirm the status of data writing by said write control means under a condition ensuring that conductance of memory cells driven by non-selected word lines becomes larger than that during data read-out operation, by applying a verify read-out voltage to a selected word line in the selected NAND type memory cell unit and applying a third pass voltage to non-selected word lines, said third pass voltage being determined to make memory cells conductive.

According to the fourth aspect of the present invention, there is provided a nonvolatile semiconductor memory device comprising:

a memory cell unit composed of a plurality of electrically rewritable memory cells;

a bit line for exchanging data with said memory cell unit;

word lines connected to control gates of memory cells forming said memory cell unit; and a row decoder for applying a predetermined voltage to said word lines, said row decoder supplying a predetermined potential to said word lines to ensure that a cell current flowing in said memory cell unit which is made conductive upon read-out operation for judging whether predetermined data was written in one of memory cell forming said memory cell unit becomes larger than the current flowing in said memory cell unit which is made conductive upon read-out operation for specifying data written in said memory cell.

According to the fifth aspect of the present invention, there is provided a nonvolatile semiconductor memory device comprising:

a memory cell unit composed of a plurality of electrically rewritable memory cells;

a selection transistor connected between one end of said memory cell unit and said bit line;

a bit line for exchanging data with said memory cell unit;

word lines and a selection gate line connected to control gates of memory cells forming said memory cell unit and the gate of said selection transistor, respectively; and a row decoder for applying a predetermined voltage to said word lines and said selection gate line, said row decoder supplying a first pass voltage to word lines connected to non-selected memory cells among a plurality of memory cells forming said memory cell unit upon read-out operation for judging whether predetermined data was written in one of memory cell forming said memory cell unit, and said row decoder supplying a second pass voltage lower than said first voltage to word lines connected to non-selected memory cells among a plurality of memory cells forming said memory cell unit upon read-out operation for specifying data written in said memory cell.

According to the invention, by using a bias condition capable of supplying a larger memory cell current for write verify read-out operation than that for normal data read-out operation, it is possible to prevent the data write time from increasing when the capacity of the memory cell array is increased, and high-speed rewriting of EEPROM can be realized.

More specifically, the invention is effective when the memory cell area per bit decreases as a result of an increase of memory cells in a NAND type memory cell unit (hereinafter simply called NAND cell) in NAND type EEPROM. In this case, degradation of the rewriting speed caused by a decrease of the memory cell current can be compensated by using a condition for increasing the memory cell current in the write verify read-out operation as compared with that for normal read-out operation. As a result, both a reduction of the bit cost of NAND type EEPROM and its high-speed rewriting performance can be attained.

Furthermore, when the pass voltage applied to non-selected word lines during write verify read-out operation is made higher than that during normal read-out operation, the memory cell current increases, and it results in enlarging the write margin. That is, the write mode means that the threshold voltage becomes a value beyond the verify read-out voltage applied to a selected word line during write verify read-out operation. Therefore, if a large memory cell current is supplied during write verify read-out operation to conduct judgment of "0" and "1", it results in judging a status with a sufficiently large threshold voltage relative to the verify read-out voltage as the write mode.

Therefore, it is effective for enlarging the margin for the threshold value voltage and increasing the reliability.

BRIEF DESCRIPTION OF THE DRAWINGS

FIG. 8 is a diagram showing a biasing relation during data write operation of the same NAND type EEPROM;

FIG. 10 is a diagram showing a biasing relation during verify read-out operation after write operation of the same NAND type EEPROM;

FIG. 12 is a diagram showing a biasing relation during data read-out operation of the NAND type EEPROM;

FIG. 16 is a diagram showing a relation between the number of memory cells in a NAND cell of a NAND type EEPROM and the effective memory cell area per bit.

DETAILED DESCRIPTION OF THE PREFERRED EMBODIMENTS

Figure 1:
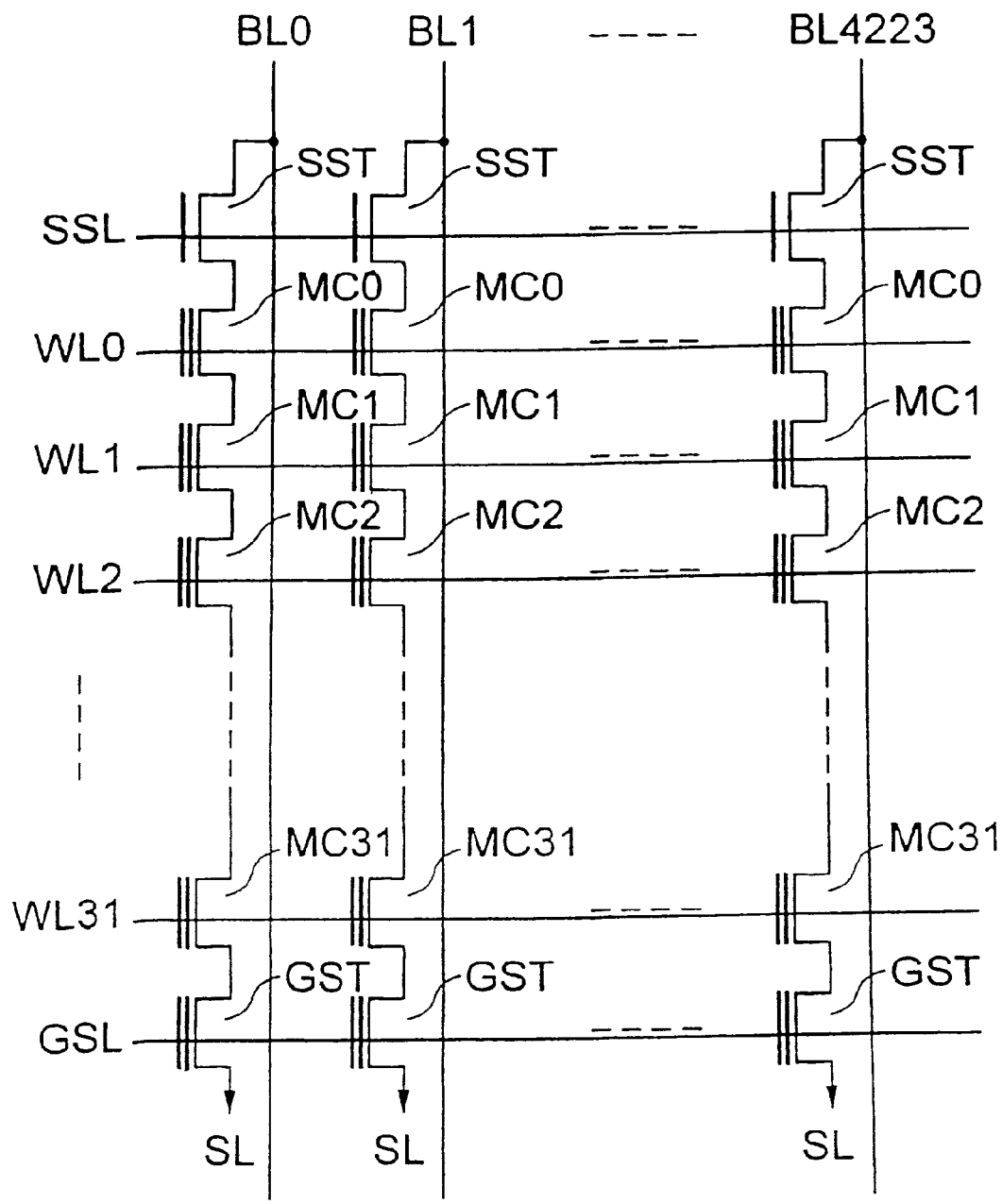
FIG. 1 is an equivalent circuit of a memory cell array of NAND type EEPROM according to an embodiment of the invention.

FIG. 1 shows an equivalent circuit of a single NAND cell block 1 in a memory cell array of NAND type EEPROM according to an embodiment of the invention. Here is shown an example in which the number of bit lines BL is 528 bytes ((512+16)×8=4224). In this embodiment, a single NAND cell is composed of 32 memory cell transistors MC0 through MC31. The memory cell transistors MC0 through MC31 are serially connected between a bit line BL and a source line SL. Between the bit line BL and the memory transistor MC0, a selection transistor SST is provided. Also between the source line SL and the memory cell transistor MC31, a selection transistor GST is provided similarly.

Figure 2:
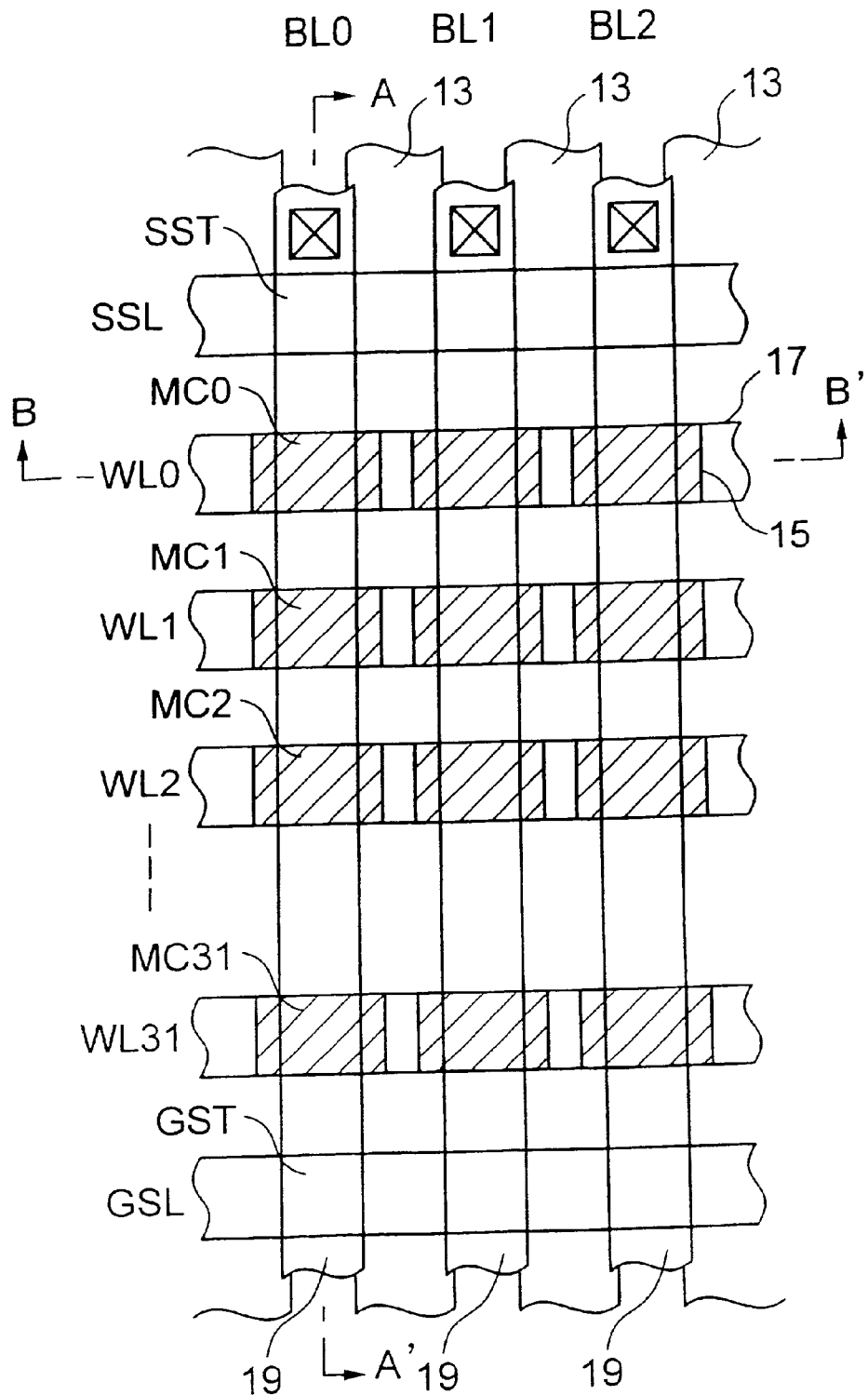
FIG. 2 is a layout of the same memory cell array.
Figure 3:
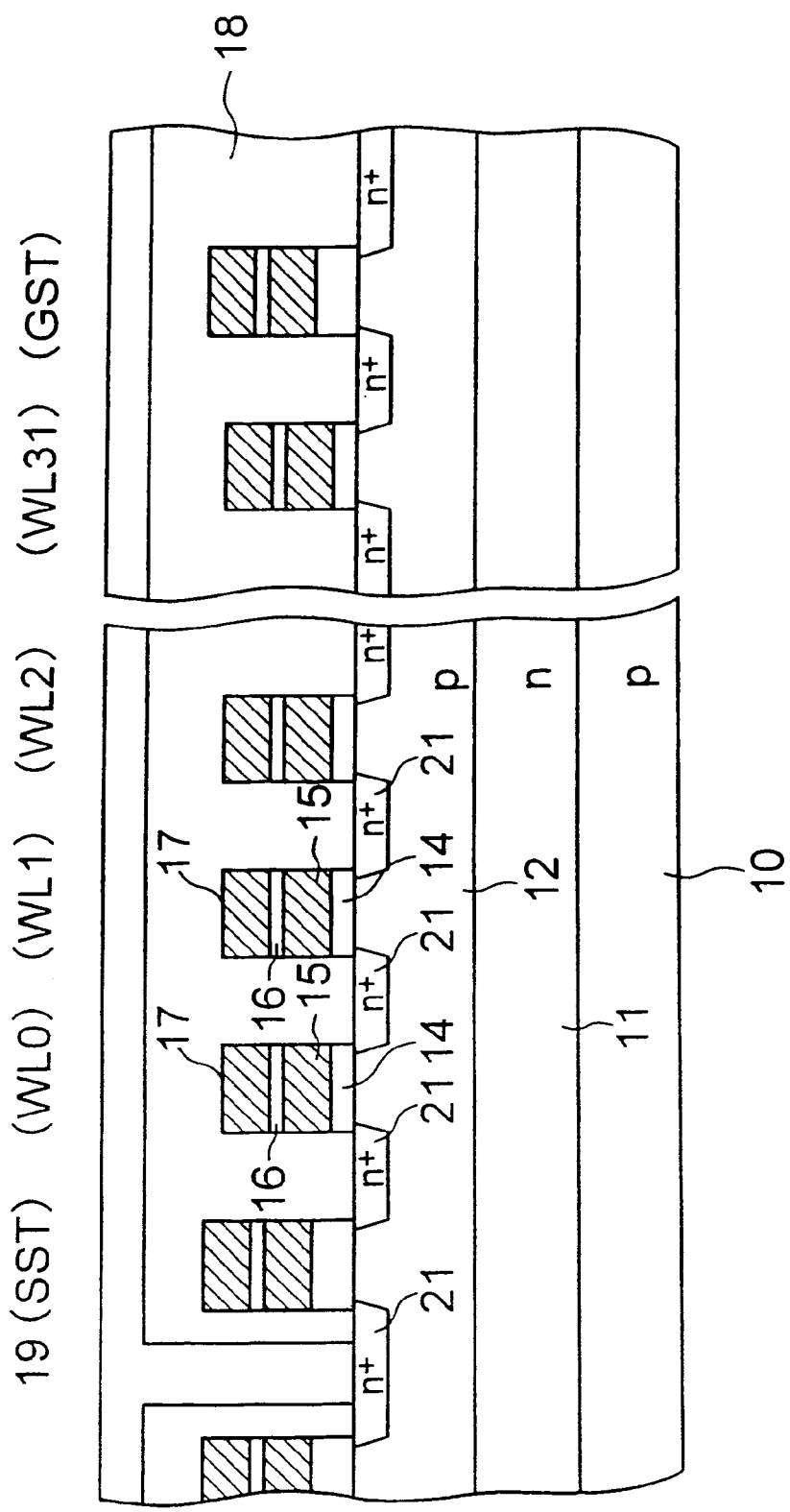
FIG. 3 is a cross-sectional view taken along the A–A' line of FIG. 2.
Figure 4:
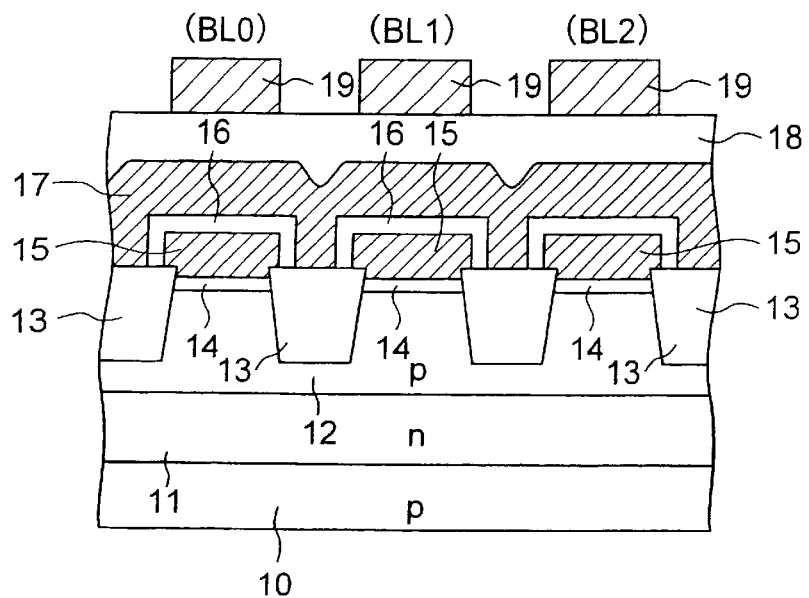
FIG. 4 is a cross-sectional view taken along the B–B' line of FIG. 2.

FIG. 2 is a layout of the same memory cell array, and FIG. 3 and FIG. 4 show A–A' and B–B' cross-sectional aspects of FIG. 2. In a memory cell array region of a p-type silicon substrate 10, an n-type well 11 is formed, and a p-type well 12 is formed in the n-type well 11. The p-type well 12 is divided into respective device regions by a device isolating insulating film 13. In each device region, a floating gate 15 for an individual memory cell transistor is formed via a tunneling oxide film 14, and a control gate 17 is formed thereon via an inter-layer gate insulating film 16.

Such control gates 17 are aligned in the row direction as shown in FIG. 2, and function as word lines WL (WO0, WL1, . . . , WL31). By ion implantation using the control gate 17 as a mask, source and drain diffusion layers 21 are made. In FIG. 3, the selection transistors SST and GST are shown as having the same structure as the memory cell transistors MC. However, as for the selection transistor SST at the drain side, in their cross-sectional aspects corresponding to the cross-sectional view of FIG. 4, the layer corresponding to the floating gates 15 and the layer corresponding to the control gates 17 are commonly connected at a certain position to extend continuously and form selection gate lines SSL. The source-side selection transistor GST is similarly configured, and its gates are provided continuously to form a selection gate line GSL. In this case, the selection transistors SST, GST and the memory cell transistor MC may be different in thickness of the gate oxide film.

Figure 5:
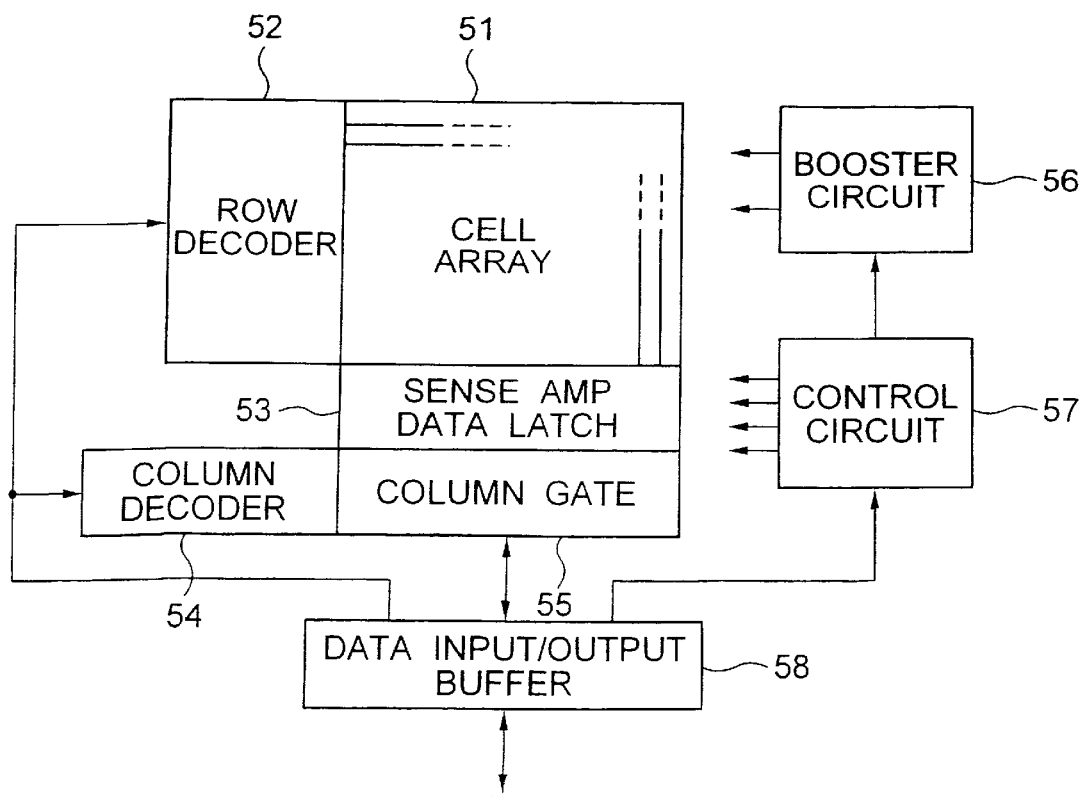
FIG. 5 is a diagram showing block configuration of the same NAND type EEPROM.

The whole block configuration of NAND type EEPROM having page write/read-out functions is as shown in FIG. 5. As illustrated, it includes a memory cell array 51, a row decoder 52 for selectively driving word lines of the memory cell array 51 in accordance with and address input from outside, and a sense amplifier circuit 53 connected to bit lines of the memory cell array 51 and having the function of latching input/output data. Connected to the sense amplifier circuit 53 is a column gate 55, and a corresponding bit line and sense amplifier are selected by controlling the column gate 55 according to an address introduced from outside by a column decoder 54.

The sense amplifier circuit 53 is connected to a data input/output (I/O) buffer 58 via the column gate 55. For the purpose of supplying a high voltage necessary for write operation and erase operation, a booster circuit 56 is provided. Further provided is a control circuit 57 for generating a control signal for erase and read-out operations, controlling the inside of the chip and providing interface with the exterior.

The row decoder 52 is used to selectively drive a plurality word lines WL in response to an address signal during data write operation, erase operation and data read-out operation, respectively, and its word line driver is supplied with an appropriate voltage. The sense amplifier circuit 53 has the function of sensing bit-line data upon reading, the data latch function for holding data loaded from outside during writing, and the function for selectively supplying appropriate voltages to bit lines BL during writing and erasure.

The control circuit 57 includes a sequence control means (for example, programmable logic array) for controlling erase and erase-verify operations, write and write-verify operations and read-out operation of NAND cells.

Figures 6, 7:
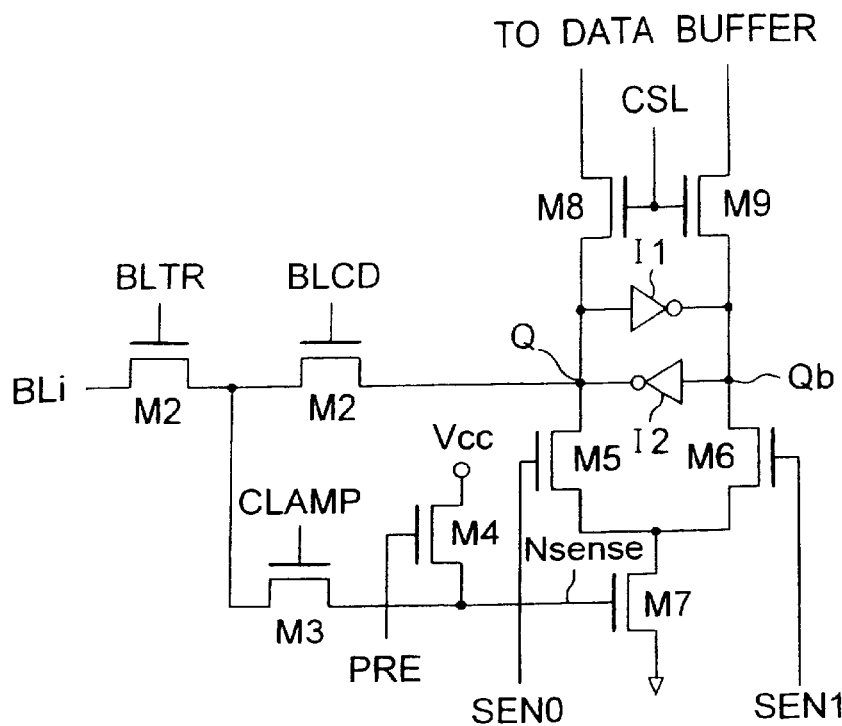
FIG. 6 is a diagram showing sense amplifier configuration of the same NAND type EEPROM.
FIG. 7 is a diagram showing a biasing relation during data erase operation of the same NAND type EEPROM.

FIG. 6 is a diagram showing configuration of a sense amplifier in the sense amplifier circuit 53. The sense amplifier has, as its main component, a data latch circuit 61 made up of inverters I1 and I2 which are connected in parallel but in opposite orientations. Nodes Q, Qb of this latch circuit 61 are connected to the drain of a sensing NMOS transistor M7 via NMOS transistors M5 and M6, respectively. The source of the sensing NMOS transistor M7 is connected to ground, and its gate functions as a sense node Nsense. The sense node Nsense is connected to a bit line BLi through transfer gates NMOS transistors M3 and M1. The NMOS transistor M1 is a high voltage-resistant transistor for the buffering purpose during data erasure.

The node Q of the latch circuit 61 is connected to the NMOS transistor M1 via an NMOS transistor M2 for transferring writing data to the bit line BLi. Nodes Q and Qb of the latch circuit 61 are also connected to a data buffer through column selection NMOS transistors M8 and M9. At the sense nose Nsense, an NMOS transistor M4 is provided for pre-charging it.

Next explained sequentially are operations for erasing, writing and reading data of NAND EEPROM according to the embodiment.

FIG. 7 shows a relation among bias voltages of different portions during data erase operation. In the NAND type EEPROM according to this embodiment, one NAND cell block is the unit for erasure. When erase operation is started, Vss (=0V) is applied to all word lines WL0 through WL31 in the selected block to be erased, and all word lines WL0 through WL31 of non-selected blocks and selection gate lines SSL, GSL are held in a floating status. Under the condition, an erase voltage Vera (=20V) is applied to P-wells of the memory cell array.

At that time, in word lines WL0 through WL31 of non-selected blocks and selection gate lines SSL and GSL, voltage is increased to xVera due to capacity coupling with P-wells. Since is approximately 0.9, the voltage rises to about 18V. Further, in the bit lines BL0, BL1 and source lines SL, the PN junction between the P-wells and the n+-type diffusion layer in the bit line contact portions and the $n^+$-type diffusion layer in the portions of the source lines SL become forward-biased, and the voltage rises to Vera-Vf. Since Vf is the built-in potential of the PN junction and approximately 0.7V, the bit line BL0, BL1 and source lines SL become approximately 10.3 V. Therefore, erase operation does not occur in memory cell transistors along the word lines WL0 to WL31 of non-selected blocks.

In memory cell transistors along the word lines WL0 to WL31 of the selected block, since Vera is applied to the substrate region and Vss to the control gates, electrons in the floating gates are released to the substrate region (P-wells) by a tunneling current, and memory data of the memory cell transistors are erased collectively.

FIG. 8 shows relation among bias voltages of respective portions during data write operation. Shown in FIG. 8 is a case where write operation is conducted for the word line WL17 in the selected block, which was erased collectively in the foregoing explanation. It is also assumed that "0" data is written in the bit line BL0, and "1" data is written in the bit line BL1 (that is, write operation is prohibited by maintaining the erase mode with "1" data).

Figure 9:
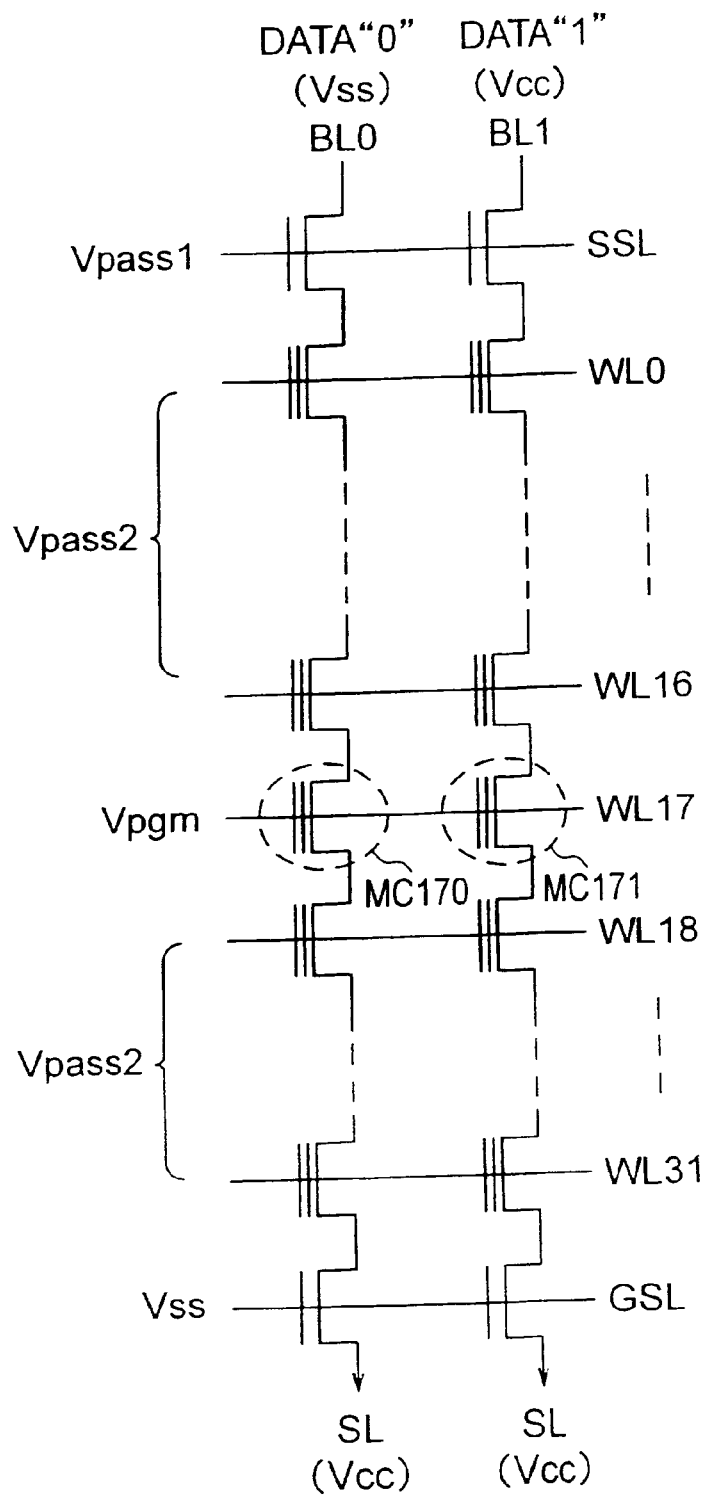
FIG. 9 is a diagram showing a biasing relation on a memory cell array.

In this case, FIG. 9 shows a relation among voltages, extracting only two bit lines BL0 and BL1 from FIG. 1.

In the data write operation, the ground potential Vss for writing and the power source potential Vcc (=3.3V) for prohibiting writing are first supplied to the bit lines BL0 and BL1, respectively. After that, while maintaining the source-lineside selection gate line GSL in Vss, a pass voltage Vpass1 (approximately 3.5 V) increased slightly higher than Vcc is applied to the other word lines and selection gate lines. As a result, Vss for writing is transferred to NAND cell channels connecting to the bit line BL0. Although Vcc for prohibition of writing is transferred to NAND cell channels connecting to the bit line BL1, when the channel potential increases to the value decreased by Vpass1–Vth (a high threshold voltage among threshold voltages of selection transistors or memory cell transistors), the selection transistor SST turns OFF and the channels become floating.

After that, under the condition, a pass voltage Vpass2 (approximately 8 to 10 V) higher than the pass voltage Vpass1 is applied to next applied to non-selected word lines WL0 through WL16 and WL18 through WL31 not to be written with data among the word lines in the selected NAND cell block, and a still higher write voltage Vpgm (about 16 V) is applied to the selected word line WL17 to be written with data. The drain-side selection gate line SSL is maintained in Vpass1.

At that time, in the channel region nearer to the bit line BL1 in the selected NAND cell block, voltage increases to ×(Vpass2–Vpass1)+(Vpass1–Vth) due to capacity coupling with the word increasing from the initial status Vpass1–Vth to Vpass2 and Vpgm. Since the pass voltage Vpass2 is applied to 31 word lines while the write voltage Vpgm is applied to only one word line, it becomes the above-mentioned channel potential substantially determined by Vpass2. is the capacity coupling ratio between the word line and the channel region, and it is approximately 0.5.

On the other hand, at the side of the bit line BL0 applied with Vss, because of Vss transferred from the bit line BL0, Vss transfers up to the channel of the selected memory cell transistor MC170. As a result, in the memory cell transistor MC170 driven by the selected word line WL17 applied with the write voltage Vpgm, write operation by tunneling injection occurs. In the other memory cells along the same bit line BL0, the applied electric field is not large, and writing does not occur.

Level of the pass voltage Vpass1 applied to the drain-side selection gate line SSL during data write operation has to be determined, taking into account the function of pre-charging the NAND cell channels prohibited to write and the function of cutting off the selection transistor SST. For the former function, the voltage s required to be high. For the latter function, however, a lower voltage is desirable. Therefore, when using the increased pass voltage Vpass1 upon first pre-charging the channel, and applying the write voltage Vpgm and pass voltage Vpass2 to the selection word line and the non-selected word lines, respectively, the voltage applied to the selection gate line SSL may be lowered to a level low enough to cut off the selection transistor SST, such as power source potential Vcc. Alternatively, the power source potential Vcc may be used from the first stage without using the increased pass voltage Vpass1.

Upon actual data write operation, control is made to drive data of one page into a predetermined threshold range by repeating application of a write voltage pulse and verify operation for checking the threshold value after writing under sequence control by the control circuit 57 shown in FIG. 5. One page is, for example, the number of bit lines in the range of one word line. However, depending upon relations with a page buffer, etc., the range of one word line may be dealt as 2 pages.

Cycle of such page-to-page data writing is explained below. First of all, write data is loaded continuously to a data latch of the sense amplifier circuit 53 of FIG. 5. At that time, "0" is the data for cells to write, and "1" is the data for cells prohibited to write. The write cycle includes the following steps.

(1) According to data latched in the sense amplifier, level of the bit line is set in Vss or Vcc.

(2) A write voltage pulse is applied to the selected word line.

(3) The selected word line is discharged.

(4) Write verify read-out operation is conducted.

In the verify operation, in the data latch corresponding to a cell in which writing is sufficient, its data changes from "0" to "1" so as to prohibit further write operation. When verify read-out operation is started, the bit line is pre-charged to the initial status Vb1 (about 1.5 V). Then, while applying a verify read-out voltage Vref (about 0.7 V) to the word line WL17 executing writing in the selected cell block, a pass voltage Vpass3 for rendering memory cells and selection transistors conductive is applied to the other non-selected word lines and selection gate lines in the cell block. The pass voltage Vpass3 is higher than the pass voltage Vpass1 (about 3.5 V) applied to non-selected word lines in the selected cell block during normal data read-out operation explained later. For example, Vpass3 may be approximately 8 V. This pass voltage Vpass3 is preferably lower than the pass voltage Vpass2 for data write operation for ensuring reliable data memory.

In actual data write operation, however, there is used a method in which both the write voltage Vpgm and the pass voltage Vpass2 are stepped up in every write cycle to 1 V and 0.5 V, for example. This is because, due to fluctuations in process among memory cells, there are memory cells having a large coupling ratio and written with data fast, and those having a small coupling ratio and written with data slowly. For example, setting Vpgm=15 V and Vpass2=8 V in the first cycle of writing and setting Vpgm=16 V and Vpass2=8.5 V in the second cycle, a plurality of write cycles are conducted. Therefore, there is the possibility that the relation becomes Vpass2>Vpass3.

As a result of the foregoing procedures, conductance of memory cell transistors and selection gate transistors becomes larger than the value of the case where the pass voltage Vpass 1 is applied to word lines and selection gate lines other than the selected word line during normal data read-out operation, and the memory cell current becomes larger than that during normal read-out operation. As a result, bit lines that read out "0" data (data of a memory cell changed to the write mode because its threshold value exceeds Vref) maintain Vb1, and bit lines that read out "1", data (data of a memory cell in the erase mode) change from Vb1 to Vss. In the same manner as the normal read-out operation, by detecting the bit line potential in the sense amplifier, "0" and "1" it are discriminated.

Figure 11:
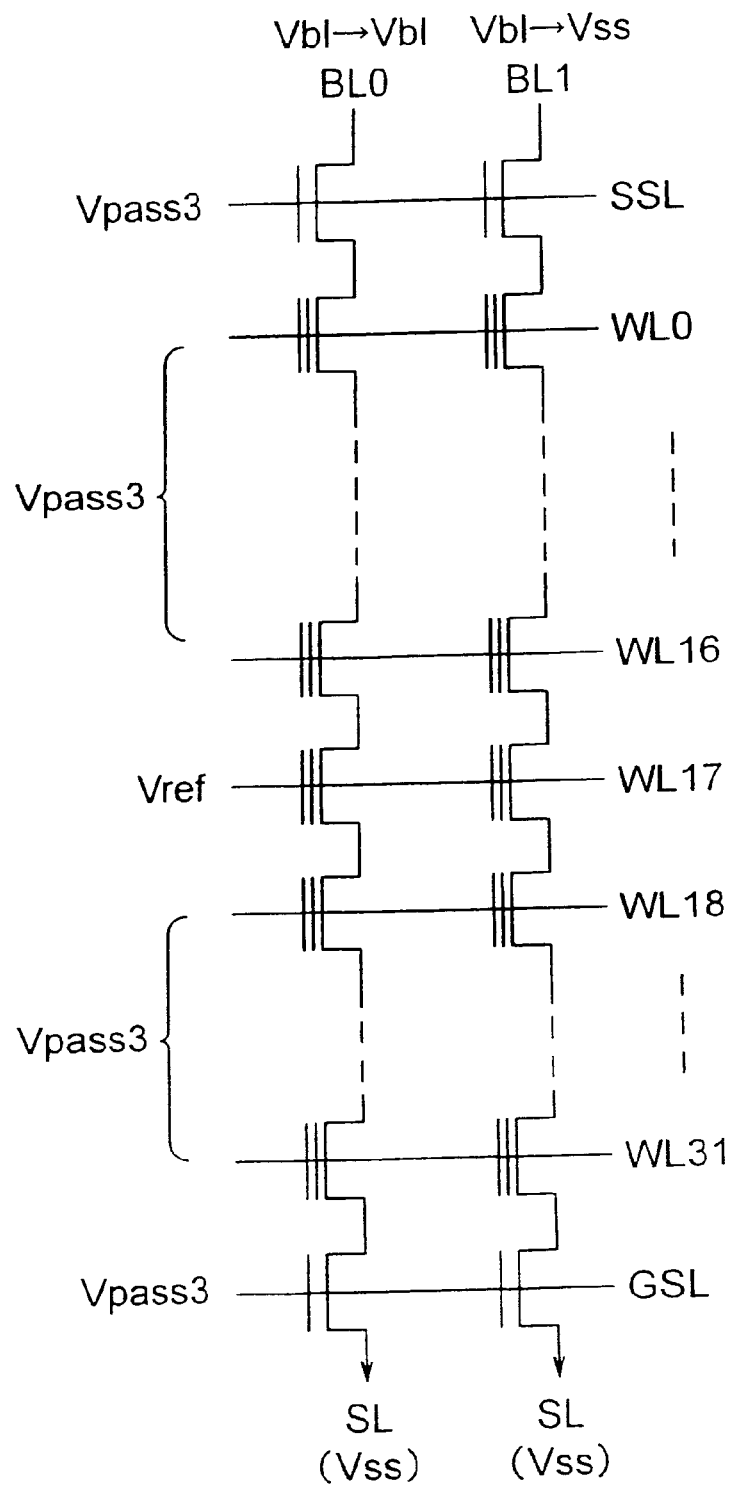
FIG. 11 is a diagram showing the biasing relation of FIG. 10 on a memory cell array.

In the example shown in FIG. 10 and FIG. 11, the same pass voltage Vpass3 is applied to the non-selected word lines WL0 through WL16, WL18 through WL31 and the selection gate lines SSL, GSL. However, non-selected word lines and selection gate lines need not be equal in voltage. That is, it is sufficient that the pass voltage Vpass3 applied to the non-selected word lines WL0 to WL16 and WL18 to WL31 has a relation with the pass voltage Vpass1 applied to non-selected word lines during normal read-out operations explained later, which satisfies Vpass1<Vpass3, and the pass voltage applied to the selection gate lines SSL and GSL may be the same voltage Vpass1 as that during normal read-out operation, for example. Alternatively, to the contrary, the pass voltage applied to the selection gate lines SSL, GSL may be Vpass 3, and the pass voltage applied to non-selected word lines may be the same voltage Vpass1 as that for normal read-out operation. In any of these cases, the memory cell current during write verify read-out operation in the NAND cell becomes larger than that during normal read-out operation, and the effect of reducing the write time can be expected.

In actual use, it is highly possible that the pass voltage applied to selected gate lines SSL, GSL is lower than Vpass3. Its reason lies in that current NAND type EEPROMs use the same tunneling oxide film (about 9 nm) for both selection gate transistors and memory transistors. Although they are different in that the voltage applied to floating gates of memory cells is substantially the control gate voltage multiplied by the coupling ratio but approximately ½ of the voltage applied to the control gate is applied to the tunneling oxide film. In contrast, in selected gate transistors, applied voltage is directly applied to the tunneling oxide film.

The pass voltage Vpass2 applied to non-selected word lines during data write operation may be once reset in the ground potential when the operation changes to verify read-out operation after writing, and the pass voltage Vpass3 may be applied upon read-out operation. Alternatively, the pass voltage Vpass2 applied to non-selected word lines during data write operation may be directly applied also for the consecutive verity read-out operation without being reset upon movement from writing to verify read-out operation.

Only for cells judge by the above write verify read-out operation to be insufficient in writing, write operation is repeated in the next cycle.

Figure 13:
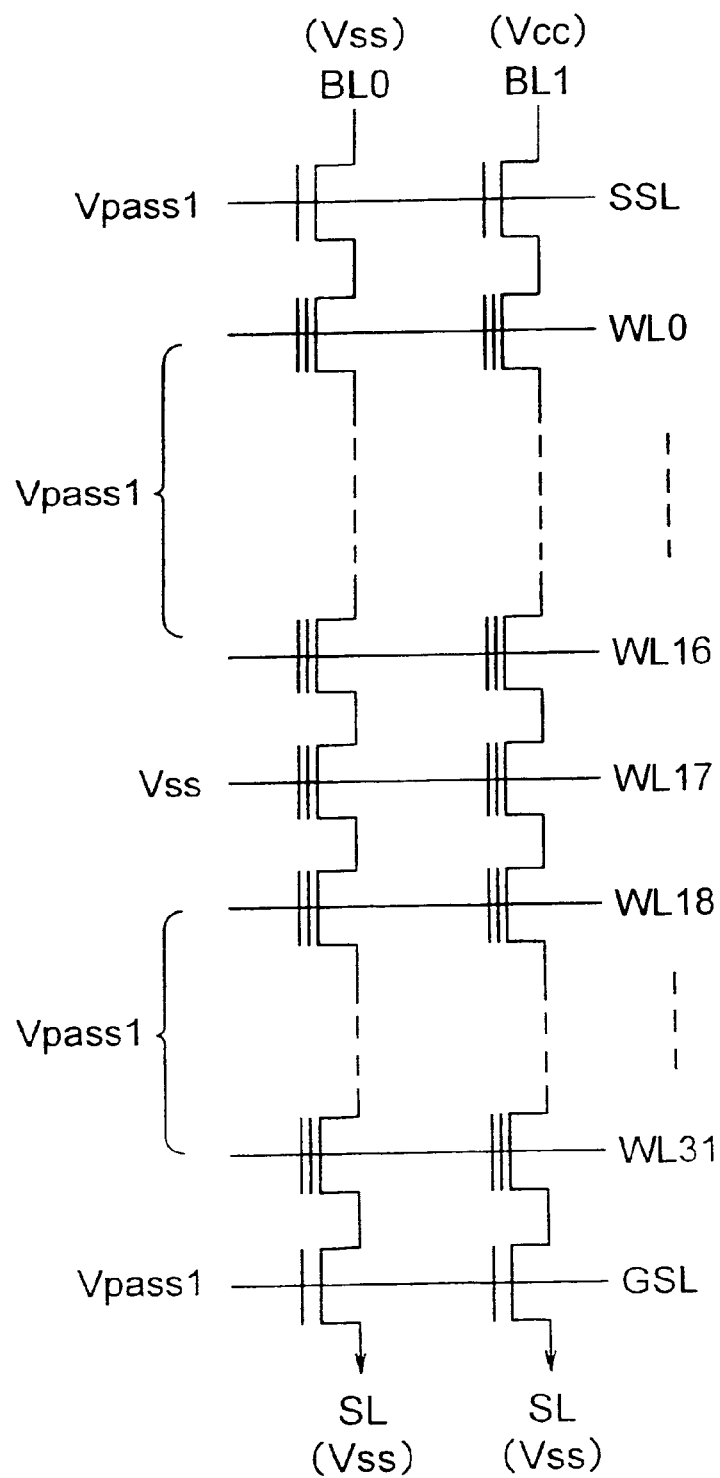
FIG. 13 is a diagram showing the biasing relation of FIG. 12 on a memory cell array.
Figures 14, 15:
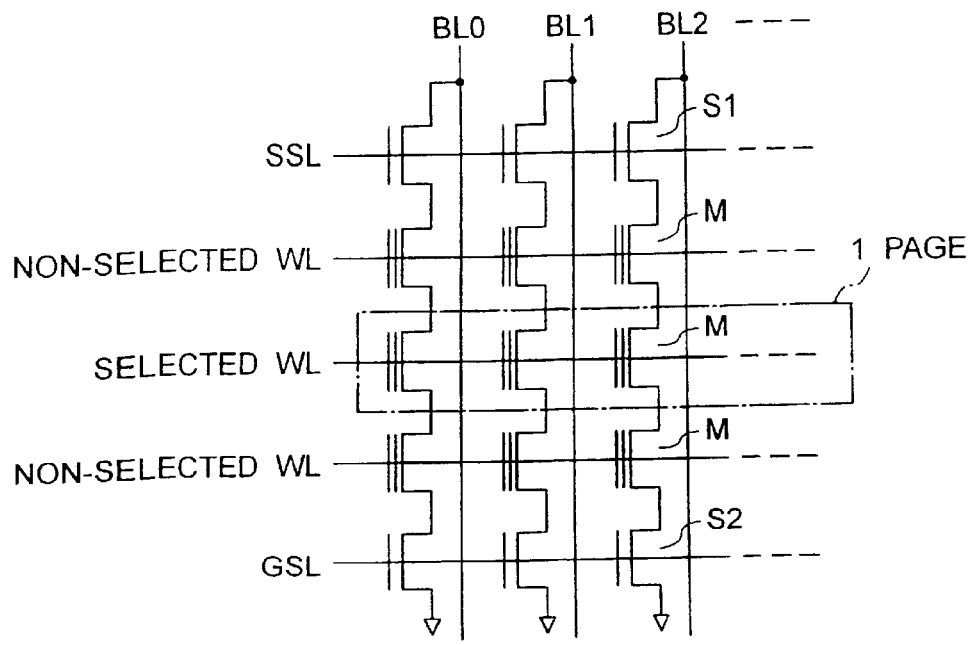
FIG. 14 is a diagram showing a memory cell array of a conventional NAND type EEPROM.
FIG. 15 is a diagram showing a biasing relation during data erase, read-out and write operations of a conventional NAND type EEPROM.

FIGS. 12 and 13 show relations among voltages at respective portions during normal data read-out operation. When read-out operation is started, bit lines are pre-charged in the initial status Vb1 (about 1.5 V). While the selected word line (WL17 in FIGS. 12 and 13) of the selected block is set in the read-out voltage Vss, the pass voltage Vpass1 is applied to all selection gate lines and non-selected word lines in the selected NAND cell. As a result, bit lines which read out "0" data (memory cells in the write status) maintain Vb1 whereas bit lines which read out "1" (memory cells in the erase status) change from Vb1 to Vss. This change in voltage of bit lines is discriminated as "0" and "1" by a sense amplifier in the same manner as the conventional technique.

As explained above, according to the embodiment, the time for writing data can be reduced by using a biasing condition permitting a larger memory cell current to flow during write verity read-out operation of NAND type EEPROM than the memory cell current during normal data read-out operation. Therefore, when the number of memory cells in each NAND cell is increased and the memory cell area per bit is decreased, degradation of the rewriting speed caused by a decrease of the memory cell current can be compensated. Thereby, both a reduction of the bit cost of NAND type EEPROM and a high-speed rewriting performance can be expected.

In the embodiments described above, the status where electrons are injected into a floating gate of a memory cell (Enhancement mode) is defined as the data "0" and the status where electrons are discharged from the floating gate (Depletion mode) is defined as the "1" data. However, both statuses can be defined vice versa.

What is claimed is:

1. A nonvolatile semiconductor memory device comprising:
    a memory cell array having a matrix arrangement of electrically rewritable memory cells which form a plurality of memory cell units each including a plurality of said memory cells;
    a decoder to decode an address and to select a memory cell of said memory cell array;
    a sense amplifier to detect read-out data from said memory cell array and to latch write data to said memory cell array;
    a read-out controller to read out data from a memory cell selected from a memory cell unit selected by said decoder;
    a write controller to write data in a memory cell selected from a memory cell unit selected by said decoder by applying a write voltage thereto; and
    a write verify read-out controller to read out data from a selected memory cell in order to confirm the status of data writing by said write controller, under a bias condition ensuring that a cell current flowing in said memory cell unit which is made conductive upon read-out operation for judging whether predetermined data was written in one of memory cell forming said memory cell unit becomes larger than the current flowing in said memory cell unit which is made conductive upon read-out operation for specifying data written in said memory cell.

2. The nonvolatile semiconductor memory device according to claim 1, wherein said write verify read-out controller controls the write verify time in substantially the same time when the number of cells are increased.

3. A nonvolatile semiconductor memory device comprising:
    a memory cell array having a matrix arrangement of electrically rewritable memory cells driven by word lines, said memory cells form a plurality of NAND-type memory cell units each including a plurality of said memory cells serially connected to a bit line, each of said NAND type memory cell unit including a first selection transistor interposed between one end of memory cells and a bit line and driven by a first selection gate line, and a second selection transistor interposed between the other end and a common source line and driven by a second selection gate line;
    a decode circuit to decode an address and selecting a word line and a bit line of said memory cell array;
    a sense amplifier circuit to detect data read out onto a bit line of said memory cell array and latching write data to said memory cell array;
    a read-out control means to read out data by applying a read-out voltage to a selected word line in an NAND type memory cell unit selected from said decode circuit and applying a first pass voltage to non-selected word lines, said first pass voltage being determined to make memory cells conductive;
    a write controller to write data by applying a write voltage to a selected word line in an NAND type memory cell unit selected by said decode circuit and applying a second pass voltage lower than said write voltage to non-selected word lines; and
    a write verify read-out controller to read data in order to confirm the status of data writing by said write controller under a condition ensuring a larger current to flow in the conductive status of the selected NAND type memory cell unit than that during data read-out operation by said read-out controller, by applying a verify read-out voltage to a selected word line in the selected NAND type memory cell unit and applying a third pass voltage to non-selected word lines, said third pass voltage being determined to make memory cells conductive,
    wherein said first and second selection gate lines of the selected NAND type memory cell unit are applied with said first pass voltage upon data read-out operation by said read-out controller,
    said first and second selection gate lines of the selected NAND type memory cell unit are applied with said first or third pass voltage during write verify read-out operation by said write verify read-out controller and wherein said first selection gate line is applied with:
the first pass voltage during an initial channel precharging with application of a program voltage to a selected word line and a non-selected word line;
level enough to cut off the selection transistor when the second pass voltage is applied.

4. The nonvolatile semiconductor memory device according to claim 3, wherein the level enough to cut off the selection transistor is a power source potential Vcc.

5. A nonvolatile semiconductor memory device comprising:

a memory cell array having a matrix arrangement of electrically rewritable memory cells driven by word lines, said memory cells form a plurality of NAND-type memory cell units each including a plurality of said memory cells serially connected to a bit line, each of said NAND type memory cell unit including a first selection transistor interposed between one end of memory cells and a bit line and driven by a first selection gate line, and a second selection transistor interposed between the other end and a common source line and driven by a second selection gate line;

a decode circuit for decoding an address and selecting a word line and a bit line of said memory cell array;

a sense amplifier circuit to detect data read out onto a bit line of said memory cell array and latching write data to said memory cell array;

a read-out controller to read out data by applying a read-out voltage to a selected word line in an NAND type memory cell unit selected from said decode circuit and applying a first pass voltage to non-selected word lines, said first pass voltage being determined to make memory cells conductive;

a write controller to write data by applying a write voltage to a selected word line in an NAND type memory cell unit selected by said decode circuit and applying a second pass voltage lower than said write voltage to non-selected word lines; and a write verify read-out controller to read data in order to confirm the status of data writing by said write control means under a condition ensuring a larger current to flow in the conductive status of the selected NAND type memory cell unit than that during data read-out operation by said read-out controller, by applying a verify read-out voltage to a selected word line in the selected NAND type memory cell unit and applying a third pass voltage to non-selected word lines, said third pass voltage being determined to make memory cells conductive, wherein said first and second selection gate lines of the selected NAND type memory cell unit are applied with said first pass voltage upon data read-out operation by said read-out controller, said first and second selection gate lines of the selected NAND type memory cell unit are applied with said first or third pass voltage during write verify read-out operation by said write verify read-out controller; and wherein said write verify read-out controller supplies the third pass voltage to non-selected word lines, the third pass voltage being higher than the first pass voltage for normal read-out operation, and supplies the first pass voltage to the first and second selection gate lines.

6. A nonvolatile semiconductor memory device comprising:

a memory cell array having a matrix arrangement of electrically rewritable memory cells driven by word lines, said memory cells form a plurality of NAND-type memory cell units each including a plurality of said memory cells serially connected to a bit line, each of said NAND type memory cell unit including a first selection transistor interposed between one end of memory cells and a bit line and driven by a first selection gate line, and a second selection transistor interposed between the other end and a common source line and a driven by a second selection gate line;

a decode circuit to decode an address and selecting a word line and a bit line of said memory cell array;

a sense amplifier circuit to detect data read out onto a bit line of said memory cell array and latching write data to said memory cell array;

a read-out controller to read out data by applying a read-out voltage to a selected word line in an NAND type memory cell unit selected from said decode circuit and applying a first pass voltage to non-selected word lines, said first pass voltage being determined to make memory cells conductive;

a write controller to write data by applying a write voltage to a selected word line in an NAND type memory cell unit selected by said decode circuit and applying a second pass voltage lower than said write voltage to non-selected word lines; and a write verify read-out controller to read data in order to confirm the status of data writing by said write controller under a condition ensuring a larger current to flow in the conductive status of the selected NAND type memory cell unit than that during data read-out operation by said read-out controller, by applying a verify read-out voltage to a selected word line in the selected NAND type memory cell unit and applying a third pass voltage to non-selected word lines, said third pass voltage being determined to make memory cells conductive, wherein said first and second selection gate lines of the selected NAND type memory cell unit are applied with said first pass voltage upon data read-out operation by said read-out controller, said first and second selection gate lines of the selected NAND type memory cell unit are applied with said first or third pass voltage during write verify read-out operation by said write verify read-out controller; and wherein said write verify read-out controller supplies the first pass voltage to non-selected word lines, and supplies the third pass voltage or lower to the first and second selection gate lines.

* * * * *